(12) United States Patent
Patel

(10) Patent No.: US 10,461,205 B2
(45) Date of Patent: Oct. 29, 2019

(54) SOLAR PANEL HOUSING

(71) Applicant: Rajul R. Patel, Canton, MI (US)

(72) Inventor: Rajul R. Patel, Canton, MI (US)

(*) Notice: Subject to any disclaimer, the term of this patent is extended or adjusted under 35 U.S.C. 154(b) by 11 days.

(21) Appl. No.: 14/797,177

(22) Filed: Jul. 12, 2015

(65) Prior Publication Data

US 2015/0318819 A1    Nov. 5, 2015

Related U.S. Application Data

(63) Continuation-in-part of application No. 13/444,842, filed on Apr. 11, 2012, now Pat. No. 9,082,913.

(60) Provisional application No. 61/474,277, filed on Apr. 12, 2011.

(51) Int. Cl.
| | |
|---|---|
| *H02S 30/10* | (2014.01) |
| *H01L 31/048* | (2014.01) |
| *F24S 10/40* | (2018.01) |
| *F24S 80/45* | (2018.01) |
| *F24S 80/457* | (2018.01) |
| *F24S 80/30* | (2018.01) |
| *F24S 80/70* | (2018.01) |
| *H02S 20/23* | (2014.01) |
| *H02S 40/44* | (2014.01) |
| *F24S 80/50* | (2018.01) |

(52) U.S. Cl.
CPC ............ *H01L 31/048* (2013.01); *F24S 10/40* (2018.05); *F24S 80/30* (2018.05); *F24S 80/45* (2018.05); *F24S 80/457* (2018.05); *F24S 80/70* (2018.05); *H02S 20/23* (2014.12); *H02S 30/10* (2014.12); *H02S 40/44* (2014.12); *F24S 2080/502* (2018.05); *Y02B 10/12* (2013.01); *Y02B 10/20* (2013.01); *Y02B 10/70* (2013.01); *Y02E 10/40* (2013.01); *Y02E 10/50* (2013.01); *Y02E 10/60* (2013.01)

(58) Field of Classification Search
CPC .......... H02S 30/10; H02S 40/40; H02S 40/42; H02S 40/425; H02S 40/44
See application file for complete search history.

(56) References Cited

U.S. PATENT DOCUMENTS

| | | |
|---|---|---|
| 3,995,615 A | 12/1976 | Hojnowski |
| 4,033,325 A | 7/1977 | Walker |
| 4,099,517 A | 7/1978 | McRae |
| 4,156,419 A | 5/1979 | Lewis, Sr. |

(Continued)

FOREIGN PATENT DOCUMENTS

| | | |
|---|---|---|
| WO | WO2009137348 | 11/2009 |
| WO | WO2010013691 | 2/2010 |

*Primary Examiner* — Bethany L Martin
(74) *Attorney, Agent, or Firm* — Mastrogiacomo PLLC

(57) ABSTRACT

A housing for a solar panel is provided and is comprised of a glazed element and a tray. The tray includes a plate, a pair of side walls, a top end cap and a bottom end cap. The tray also includes a lip configured to seat the glazed element. Wherein the plate, the pair of side walls, the top end cap, the bottom end cap are formed of a single material and configured as a single integral component and wherein the plate, the pair of side walls, the top end cap and the bottom end cap are collectively configured to form a cavity. Wherein said top end cap includes a top header, said top header extending the length of said top end cap and said top header extending outward from said top end cap and in a direction away from said cavity.

21 Claims, 17 Drawing Sheets

(56) References Cited

U.S. PATENT DOCUMENTS

| | | |
|---|---|---|
| 4,167,935 A | 9/1979 | Severson |
| 4,226,256 A | 10/1980 | Hawley |
| 4,278,074 A | 7/1981 | Uroshevich |
| 4,289,113 A | 9/1981 | Whittemore |
| 4,289,120 A | 9/1981 | Ward |
| 4,300,535 A | 11/1981 | Munroe |
| 4,331,492 A | 5/1982 | Dominguez et al. |
| 4,350,145 A | 9/1982 | Bianchini |
| 4,377,156 A | 3/1983 | Schelzig |
| 4,493,940 A | 1/1985 | Takaoka |
| 4,498,265 A | 2/1985 | Leflar et al. |
| 4,505,261 A | 3/1985 | Hunter |
| 4,966,655 A | 10/1990 | Wilkerson |
| 5,408,990 A | 4/1995 | Edling |
| 5,411,015 A | 5/1995 | Stames |
| 5,440,849 A | 8/1995 | Agrawal et al. |
| 5,522,944 A | 6/1996 | Elazari |
| 5,551,991 A | 9/1996 | Avero |
| 5,596,981 A | 1/1997 | Soucy |
| 5,645,045 A | 7/1997 | Breslin |
| 6,047,697 A | 4/2000 | Best |
| 6,066,797 A | 5/2000 | Toyomura et al. |
| 6,196,216 B1 | 3/2001 | Kooij |
| 6,414,237 B1 | 7/2002 | Boer |
| 6,722,358 B2 | 4/2004 | Rhodes |
| 6,807,963 B1 | 10/2004 | Miedermeyer |
| 6,814,070 B2 | 11/2004 | Bourne et al. |
| 6,968,654 B2 | 11/2005 | Moulder et al. |
| 7,604,003 B2 | 10/2009 | Merrett |
| 8,191,321 B2 | 6/2012 | McClellan et al. |
| 2004/0182432 A1 | 9/2004 | Yoda et al. |
| 2006/0124167 A1 | 6/2006 | Fan et al. |
| 2007/0039611 A1 | 2/2007 | Benvenuti |
| 2008/0098750 A1 | 5/2008 | Busier |
| 2008/0302030 A1 | 12/2008 | Stancel et al. |
| 2009/0194147 A1* | 8/2009 | Grommesh ......... B32B 37/1018 136/251 |
| 2009/0205704 A1 | 8/2009 | Flaherty et al. |
| 2010/0206300 A1* | 8/2010 | Shabtay ................ F24J 2/245 126/663 |
| 2011/0126888 A1 | 6/2011 | Naitoh et al. |
| 2011/0186109 A1 | 8/2011 | Elazari |
| 2012/0234379 A1* | 9/2012 | Takenaka ............... F24J 2/4614 136/251 |
| 2012/0255244 A1 | 10/2012 | Hendrickson et al. |
| 2013/0160824 A1* | 6/2013 | Khouri ................. H01L 31/048 136/251 |
| 2013/0284239 A1* | 10/2013 | Mun ...................... H01L 31/02 136/251 |
| 2014/0041706 A1* | 2/2014 | Haddock ............... F24J 2/5258 136/244 |
| 2014/0182663 A1* | 7/2014 | Kuo .................... H01L 31/0422 136/251 |
| 2016/0043686 A1* | 2/2016 | Hsueh .................... H02S 20/23 52/60 |

\* cited by examiner

SOLAR PANEL HOUSING

CROSS REFERENCE TO RELATED APPLICATIONS

This patent application claims the benefit of priority based on a continuation-in-part of U.S. patent application Ser. No. 13/444,842 filed on Apr. 11, 2012, which is incorporated by reference in its entirety for all purposes and claims the benefit of priority based on U.S. Provisional Patent Application No. 61/474,277 filed on Apr. 12, 2011, which is incorporated by reference in its entirety for all purposes.

STATEMENT REGARDING FEDERALLY SPONSORED RESEARCH OR DEVELOPMENT

Not Applicable

INCORPORATION-BY-REFERENCE OF MATERIAL SUBMITTED ON COMPACT DISC

Not Applicable

BACKGROUND OF THE INVENTION

1. Field of the Invention

The present invention relates generally to solar panels for converting solar energy into electrical and thermal energy and, more particularly, to a lightweight and inexpensive solar panel housing.

2. Background Art

As the world demand for natural resources, such as petroleum oil, petroleum products, natural gas, coal and the like, continues to rise, there is an ever increasing need to identify and use alternative forms of energy in an attempt to conserve what remains of a finite supply of natural resources. Alternative forms of energy are in use today and may include water or hydro, wind, and solar power to name a few. Of these alternative forms of energy, most often, solar power is seen as one of the most abundant forms of renewable energy.

Generally, solar power may be collected from the sun and transformed into electrical or thermal energy through the use of solar panels. Solar energy conversions components such as photovoltaics are typically used to collect solar energy and covert the solar energy directly into electricity. Many photovoltaics may be connected to form a solar panel. Many solar panels may be arranged in an array on the tops of buildings or on the ground and are generally required to produce enough electrical energy to supply electrical power to a building.

Alternatively, solar panels may be used to change the sun's solar energy into thermal energy to heat water that may be used for bathing, washing and swimming. As with photovoltaic solar panels, solar energy conversion components such as thermal fin tubes may be added to solar panel housings. The thermal solar panels may be arranged in an array on the roof or a building or on the ground such that each of the panels may be connected together through plumbing to allow water or other fluids to circulate through the pipes of the panels. As the water or other fluids circulate through the pipes and solar panels, the solar energy captured by the thermal panels will increase the temperature in the water or other fluids. The heated water or fluids may then been stored or used right way.

Although solar energy is quite useful and abundant, presently the conversion from solar energy to electricity is quite inefficient. Because of this inefficiency, many photovoltaic panels are connected together through an array of solar panels, as described above, such that enough solar energy may be collected and converted to electrical power to operate lighting and appliances in a home. In commercial applications, there is a need for even more solar panels to collect and convert enough electrical energy to operate a large commercial building.

While the conversion from solar energy to thermal energy may be done so more efficiently than the conversion of solar energy to electrical energy, there is still a need to use an array of solar panels to convert the sun's energy to heat fluids for a building or home. As with photovoltaic panels, a number of solar panels are needed to facilitate an adequate thermal energy transfer to heat a sufficient amount of water for use.

Often, the sizes of these solar panels are very large to accommodate the electrical or thermal internal components required for energy transfer and they may weigh hundreds of pounds. Typically, a commercial solar panel may be as large as four feet in width by eight feet in length. The housing of the solar panels are generally fabricated from a metal, such as steel, aluminum and the like, to provide rigidity and structure to the panel and to protect the internal energy transfer components from the elements of rain, wind, snow and the like. The metal housing or trays contribute to the weight of the panel and often make the panels difficult to manipulate as they are installed and often add a significant amount of weight to a non-load bearing roof.

Typically these large panels are installed on a roof of a building or in a large open space where the panels will be exposed to a vast amount of solar energy from the sun. Often, a significant frame structure is required to mount these large panels. The structures may exist of wood or metal materials and are large and cumbersome to assemble and unsightly once installed, yet are often required to secure and support the solar panel.

Therefore, a need exists for a lightweight and inexpensive solar panel housing that may be used in conjunction with solar energy conversion components for converting solar energy from the sun into useful electrical or thermal energy. Also, there exist a need for an attaching means that provides for a number of solar panels to be nested together and installed without the need for an added structure or frame.

BRIEF SUMMARY OF THE INVENTION

A housing for a solar panel is provided and is comprised of a glazed element and a tray. The tray includes a plate, a pair of side walls extending generally vertical from the plate and from opposing ends of the plate, the pair of side walls including at least one first aperture, the at least one first aperture configured to allow passage of a tube or conduit, a top end cap extending generally vertical from the plate, a bottom end cap extending generally vertical from the plate at an opposite end from the top end cap, a top surface of the pair of side walls, the top end cap and the bottom end cap. The tray further includes a lip, the lip positioned proximate a junction of the top surface of the pair of side walls, the top end cap and the bottom end cap and an interior wall of the pair of side walls, the top end cap and the bottom end cap, the lip including a seating surface that is positioned below the top surface of the pair of side walls, the top end cap and the bottom end cap, the lip extending the interior perimeter of each of the pair of side walls, the top end cap and the bottom end cap, and the lip configured to seat the glazed element such that a top surface of the glazed element is flush to the top surface of the pair of side walls, the top end cap and the bottom end cap. Wherein the plate, the pair of side walls, the top end cap, the bottom end cap, the top surface of the pair of side walls, the top end cap and the bottom end cap and the lip are formed of a single material and as a single integral component and wherein the plate, the pair of side walls, the top end cap and the bottom end cap collectively form a cavity. Wherein the top end cap includes a top header, the top header, extending the length of the top end cap the top header extending outward from the top end cap and in a direction away from said cavity, the top header including at least one pipe extending outwardly from the top header at both ends of the top header and extending the a length of the top header and throughout an interior space of the top header and at least one void extending the a length of the top header and throughout the interior space of the top header, the void positioned proximate the exterior of the pipe and distinct from the pipe and at least one hole extending from the void through said top end cap to the cavity.

BRIEF DESCRIPTION OF THE SEVERAL VIEWS OF THE DRAWINGS

The features and inventive aspects of the present invention will become more apparent from the following detailed description, claims, and drawings, of which the following is a brief description:

DETAILED DESCRIPTION OF THE INVENTION

Figure 1:
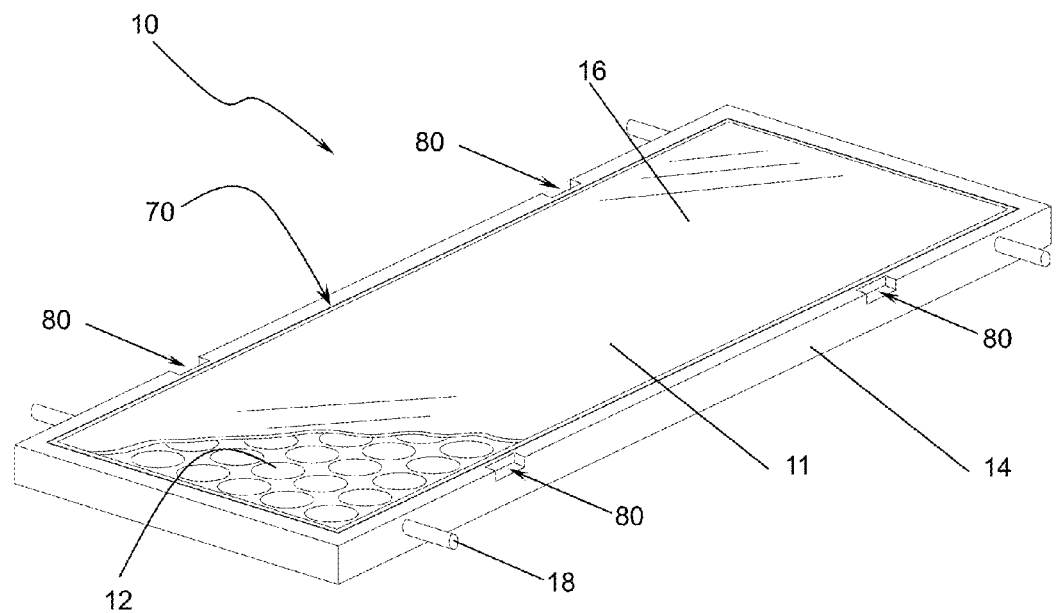
FIG. 1 is a perspective view of a solar panel according to an embodiment of the present invention.

Referring now to the drawings, preferred illustrative embodiments of the present invention are shown in detail. Although the drawings represent embodiments of the present invention, the drawings are not necessarily to scale and certain features may be exaggerated to better illustrate and explain the present invention. Further, the embodiments set forth herein are not intended to be exhaustive or otherwise to limit or restrict the invention to the precise forms and configurations shown in the drawings and disclosed in the following detailed description.

Now referring to the drawings, a solar panel 10 is illustrated in FIG. 1. This particular solar panel 10 may be used to generate electrical power from the solar energy supplied by the sun. Solar panel 10 includes an array of photovoltaic cells 12 that may be arranged and positioned in a housing 11. Housing 11 may be rectangular in shape and sized to accommodate a number of photovoltaic cells 12. Housing 11 includes a tray 14 and a glazed element 16, such as glass, low thermal emissivity glass, Halar® and the like, that covers much of tray 14 to enclose cells 12. A conduit 18 may extend from each of four corners of housing 11 through holes 64 such that electrical wiring may extend from photovoltaic cells 12 of panel 10 out through conduit 18. Conduit 18 will provide means to connect the electrical wiring of an array of panels 10 together so that more than one panel 10 may be electrically connected together as well as allowing for electrical connections into the building such that the electrical power generated by panel 10 may be supplied to the buildings for generating light, operating appliances and the like.

Figure 2:
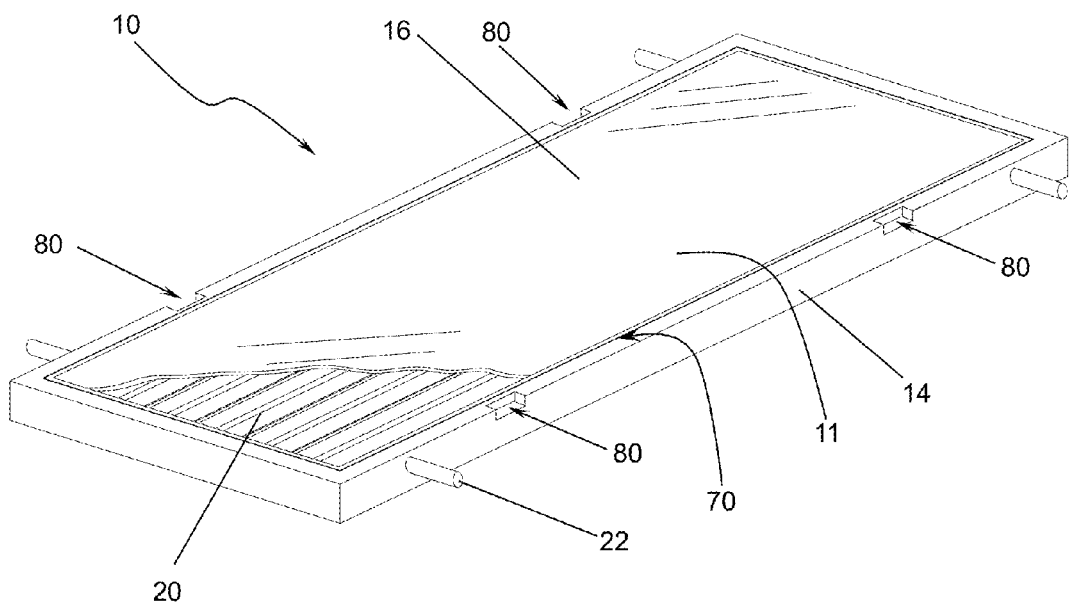
FIG. 2 is a perspective view of a solar panel according to another embodiment of the present invention.

Solar Panel 10 may also be used to generate thermal energy from the solar energy supplied by the sun for the heating of fluids, such as water. FIG. 2 illustrates solar panel 10 that is configured with a number of fin tubes 20 rather than photovoltaic cells 12. Fin tubes 20 are configured to allow fluids to flow through them. Fin tubes 20 are heated by the solar energy supplied by the sun, which, in turn, transfers the heat to the fluid within tubes 20. Pipes 22 may extend from each of four corners of housing 11 through holes 64 so that more than a one panel may be connected together as well as allowing for plumbing connections into the building such that fluid heated by panel 10 may be supplied to buildings for use in bathing, swimming, cleaning and the like.

Figure 3:
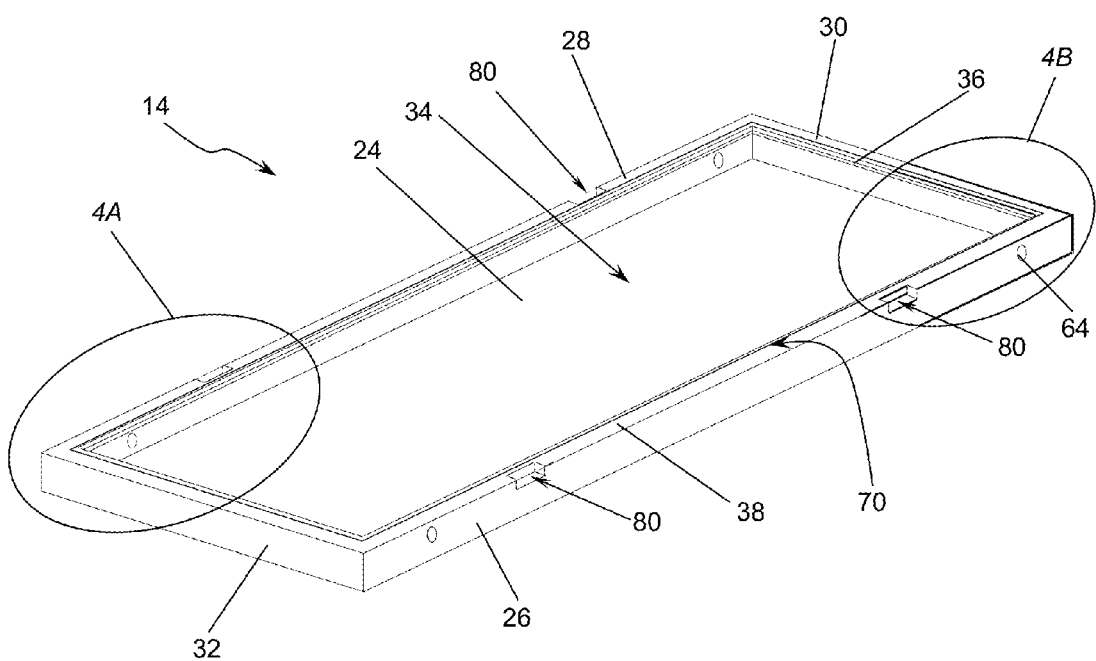
FIG. 3 is a perspective view of a solar panel housing according to an embodiment of the present invention.
Figure 4A:
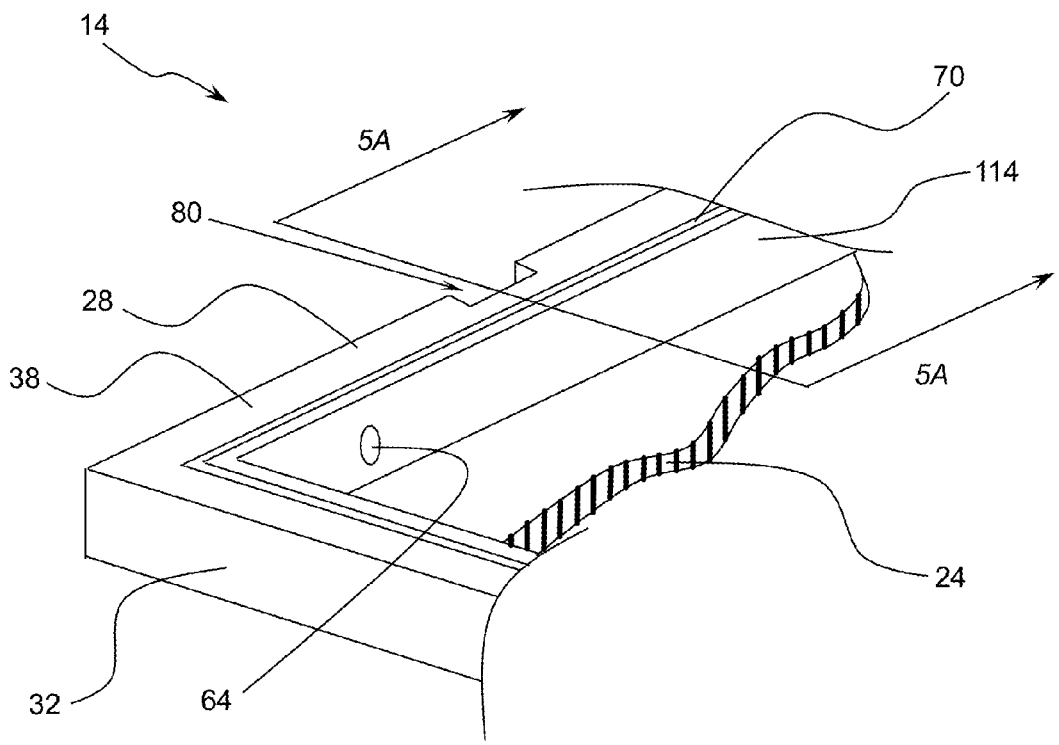
FIG. 4A is an enlarged view of a first portion of the solar panel housing according to an embodiment of the present invention.
Figure 4B:
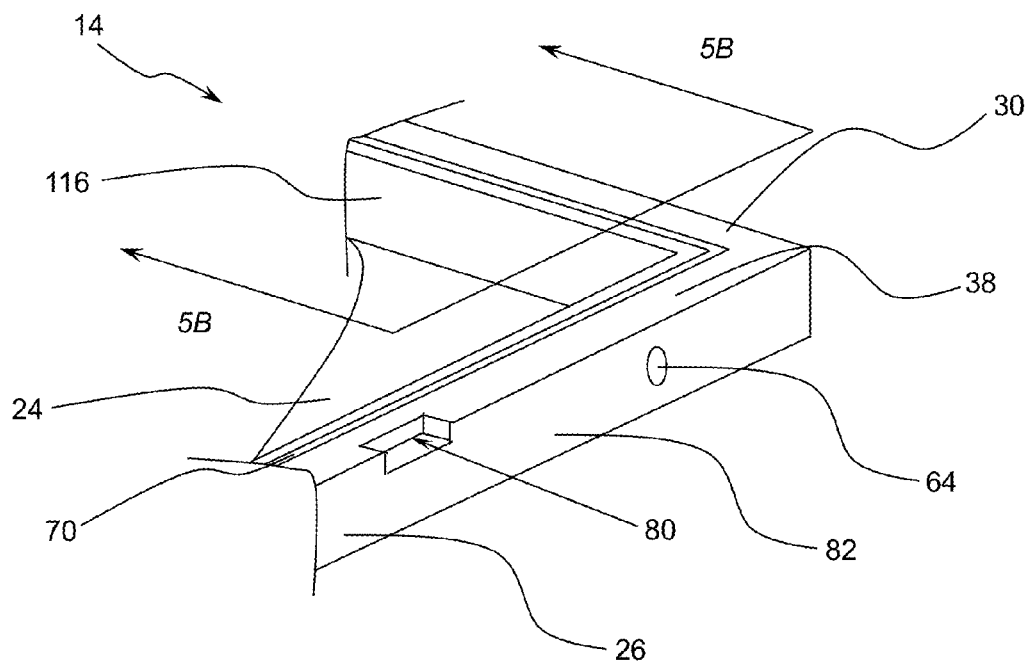
FIG. 4B is an enlarged view of a second portion of the solar panel housing according to an embodiment of the present invention.
Figure 5A:
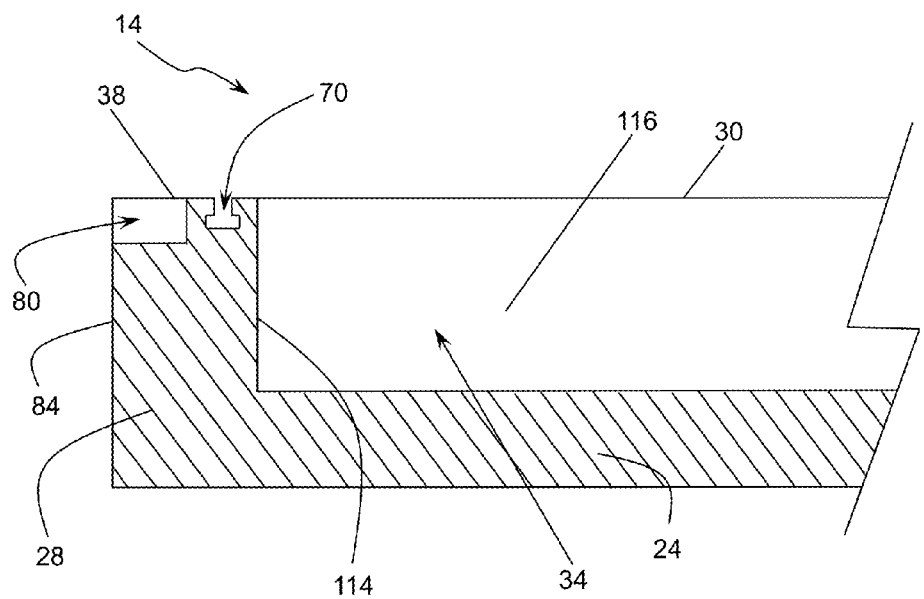
FIG. 5A is a cross-sectional view of the solar panel housing of FIG. 4A according to an embodiment of the present invention.
Figure 5B:
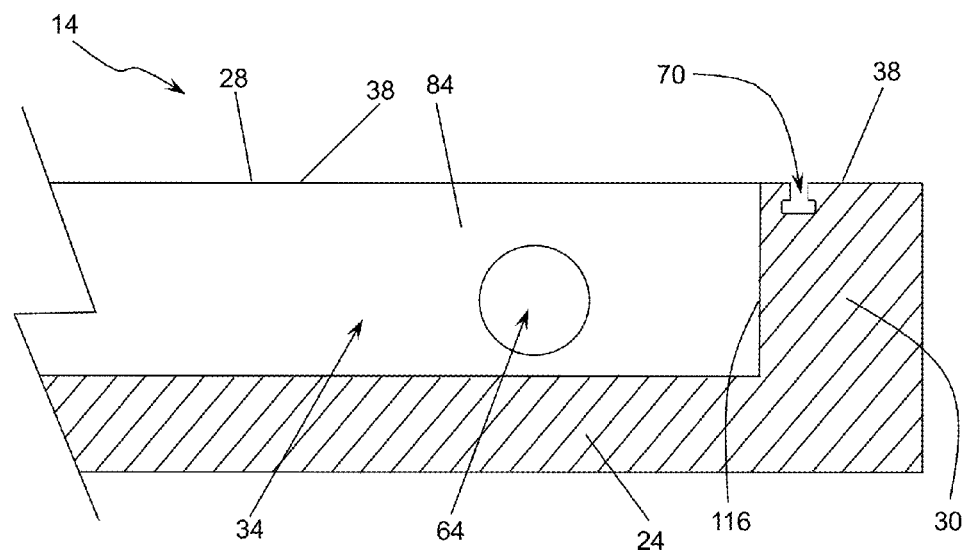
FIG. 5B is a cross-sectional view of the solar panel housing of FIG. 4B according to another embodiment of the present invention.

According to an embodiment of the present invention, tray 14 is shown in FIG. 3 and includes a bottom plate 24 and a pair of side walls 26 and 28. Tray 14 further includes a top surface 38 as well as a top end cap 30 and a bottom end cap 32. Plate 24, side walls 26 and 28, top end cap 30 and bottom end cap 32 may be configured to create a cavity 34 to house components of solar panel 10.

Side walls 26, 28 may each include a lip 36 (See e.g. FIGS. 7A-8C, 10B, 12A and 12B) that extends the length of each of walls 26, 28 near a junction of top surface 38 and interior faces 112, 114 of side walls 26, 28. Both top end cap 30 and bottom end cap 32 may also include lip 36 near a junction of top surface 38 and interior faces 116, 118 of end caps 30, 32, such that when tray 14 is assembled, lip 36 extends the inside perimeter of side walls 26, 28, top end cap 30 and bottom end cap 34. Lip 36 includes a seating surface 138. Lip 36 may be configured in this manner and sized to accept and seat glazed element 16 at surface 138 such that cavity 34 and housing 11 may be sealed to protect the solar energy conversion components and a top surface glazed element 16 is flush with top surface 38.

Figure 6A:
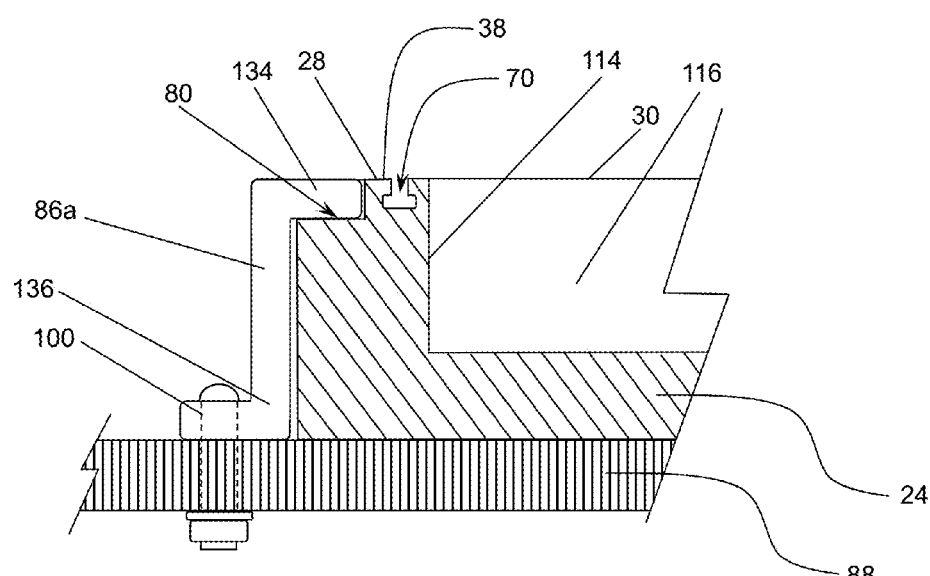
FIG. 6A is a cross-sectional view of the solar panel housing and an attachment means according to another embodiment of the present invention.
Figure 7A:
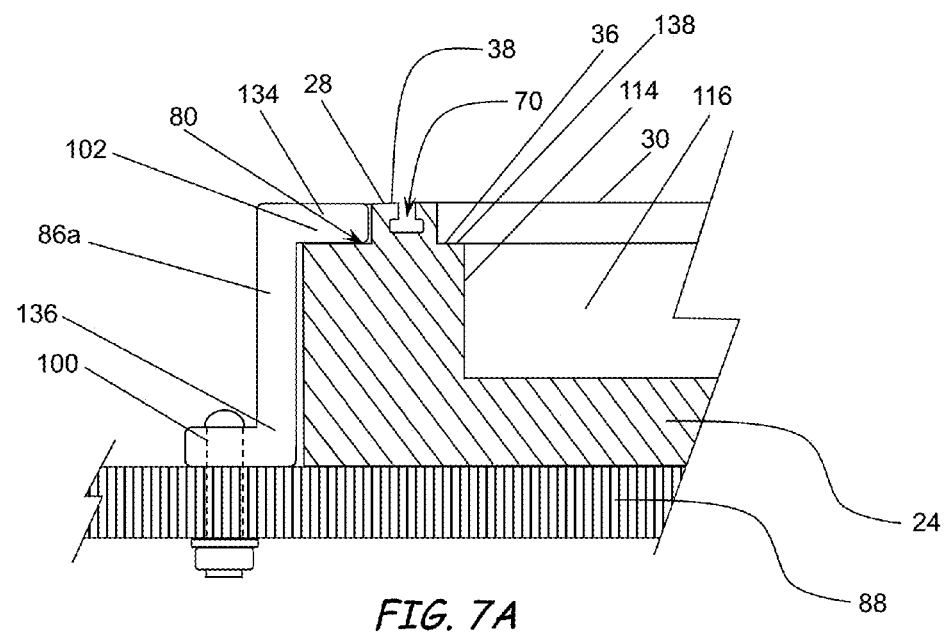
FIG. 7A is a cross-sectional view of a solar panel housing and the attachment means according to another embodiment of the present invention.

Tray 14 of housing 11 of solar panel 10 may include means to secure and mount solar panel 10 according to an embodiment of the present invention to a base 88 such as a roof, mounting bracket and the like to position the solar panel for optimal solar exposure. Side walls 26, 28 may each include at least one mounting feature such as a notch 80 at a junction of top surface 38 and an exterior face 82, 84 of each of side rails 26, 28. Notch 80 may be formed in each of side walls 26, 28 such that a step-like feature is formed at the intersection of top surface 38 and exterior faces 82, 84. Notch 80 may be formed in this manner to accept a first securement means, the first securement mean configured to engage notch 80 and secure housing 11 to base 88. In this particular embodiment, the first securement means is a bracket 86a as illustrated in FIGS. 6A and 7A to secure and mount tray 14 of panel 10 to base 88. Furthermore, the step feature of notch 80 will engage bracket 86a to capture housing 11 and prevent housing 11 from being displaced from the desired position or location when housing 11 is mounted to a surface or base 88. Top end cap 30 and bottom end cap 30 may also include at least one notch 80 (not shown) that may be formed as the step-like feature described above for side walls 26, 28 to accept bracket 86a to further secure and mount tray 14 of panel 10 to base 88.

Bracket 86a may include at least one hole 100 as illustrated in FIGS. 6A-6D that may be sized to accept a typical fastener such as a bolt, screw and the like so that bracket 86a may be secured base 88. Bracket 86a may be configured in a generally "S" shaped fashion as illustrated in the drawings. Bracket 86a may be positioned such that an upper portion 134 of bracket 86a engages notch 80 and a lower portion 136 engages base 88. Lower portion 136 includes hole 100 as described above. With bracket 86a located in position at notch 80, the fastener may be introduced into hole 100 and tightened in a typical fashion to secure bracket 86a to base 88. As the clamping force between lower portion 136 of bracket 86a and base 88 increases, the clamping force of upper portion 134 increases against notch 80 and tray 14 to secure tray 14 and housing 11 to base 88.

Figure 6B:
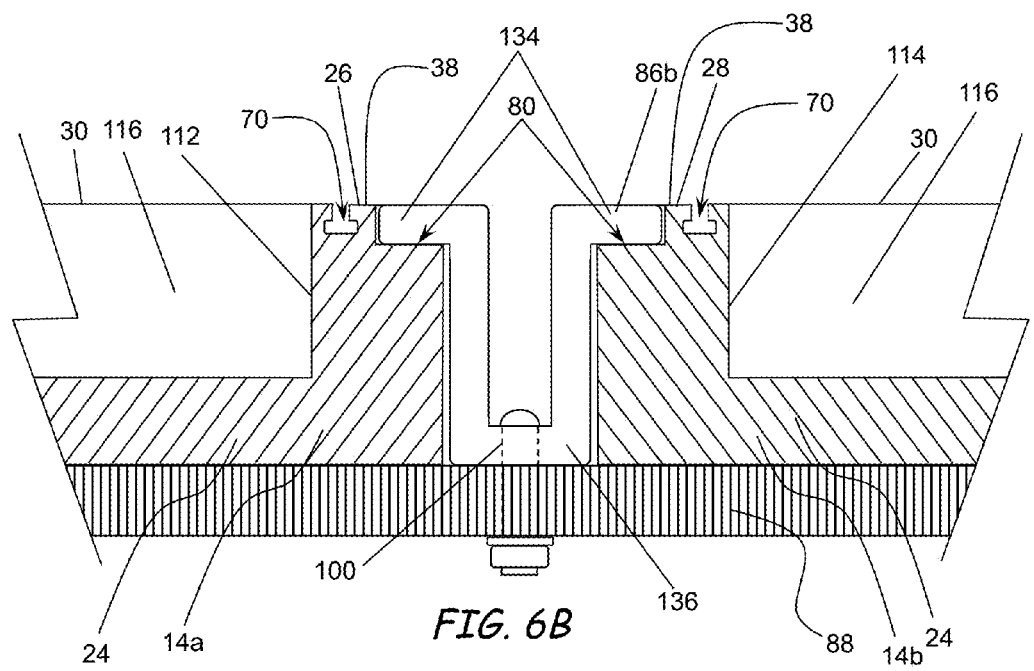
FIG. 6B is a cross-sectional view of the solar panel housing and an attachment means according to still another embodiment of the present invention.
Figure 6C:
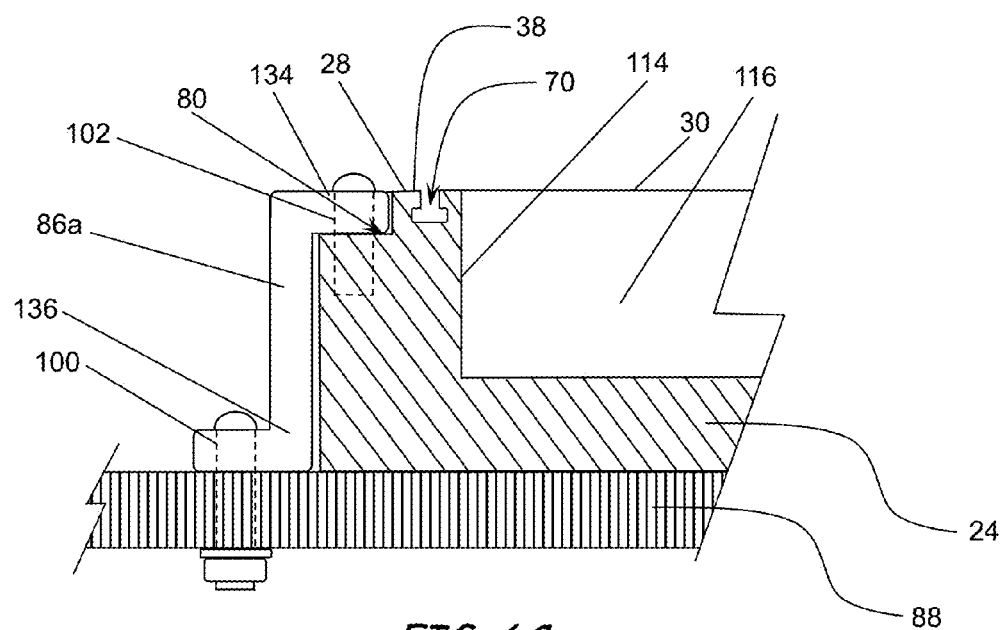
FIG. 6C is a cross-sectional view of the solar panel housing and an attachment means according to yet another embodiment of the present invention.
Figure 7B:
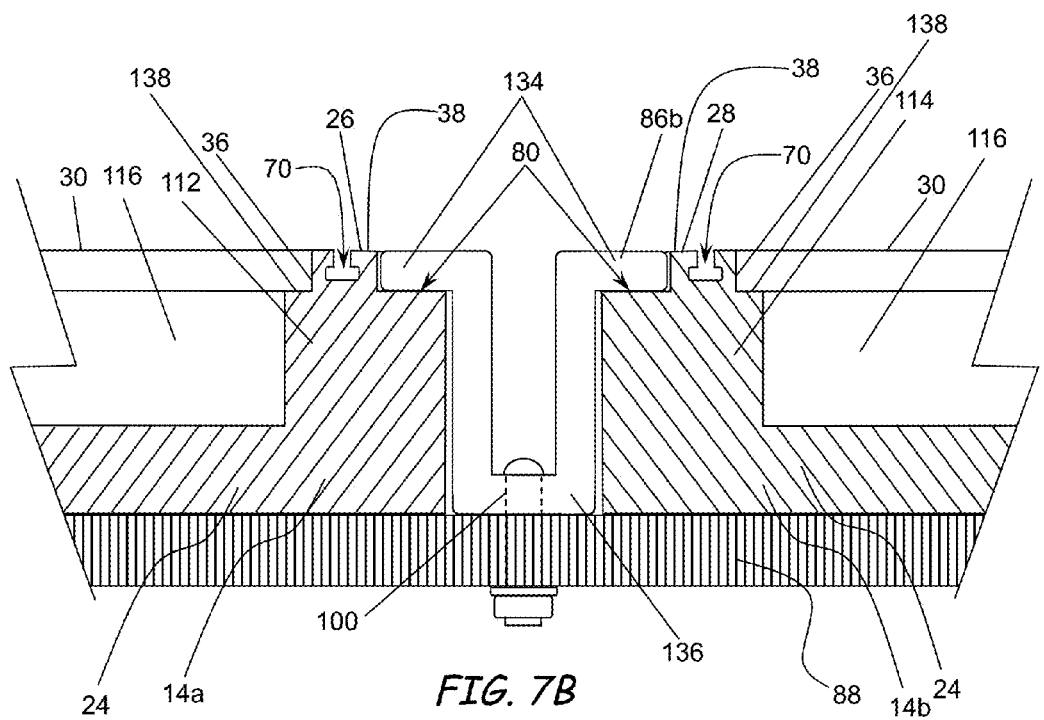
FIG. 7B is a cross-sectional view of the solar panel housing and the attachment means according to yet another embodiment of the present invention.

Bracket 86b illustrated in FIGS. 6B and 7B may be configured in a generally "U" shaped fashion as illustrated in the drawings. In this particular embodiment of the present invention, bracket 86b may include two upper portions 134 and lower portion 136. Bracket 86b may be configured in this manner to mount and secure multiple housings 11. Bracket 86b may be positioned such that upper portions 134 of bracket 86b engage notch 80 of tray 14a and notch 80 of tray 14b and a lower portion 136 engages base 88. Lower portion 136 includes hole 100 as described above. With bracket 86b located in position at notch 80, the fastener may be introduced into hole 100 and tightened in a typical fashion to secure bracket 86b to base 88. As the clamping force between lower portion 136 of bracket 86b and base 88 increases, the clamping force of upper portions 134 increases against notch 80 and tray 14a and notch 80 and tray 14b to secure tray 14a, 14b and the housings to base 88.

Figure 6D:
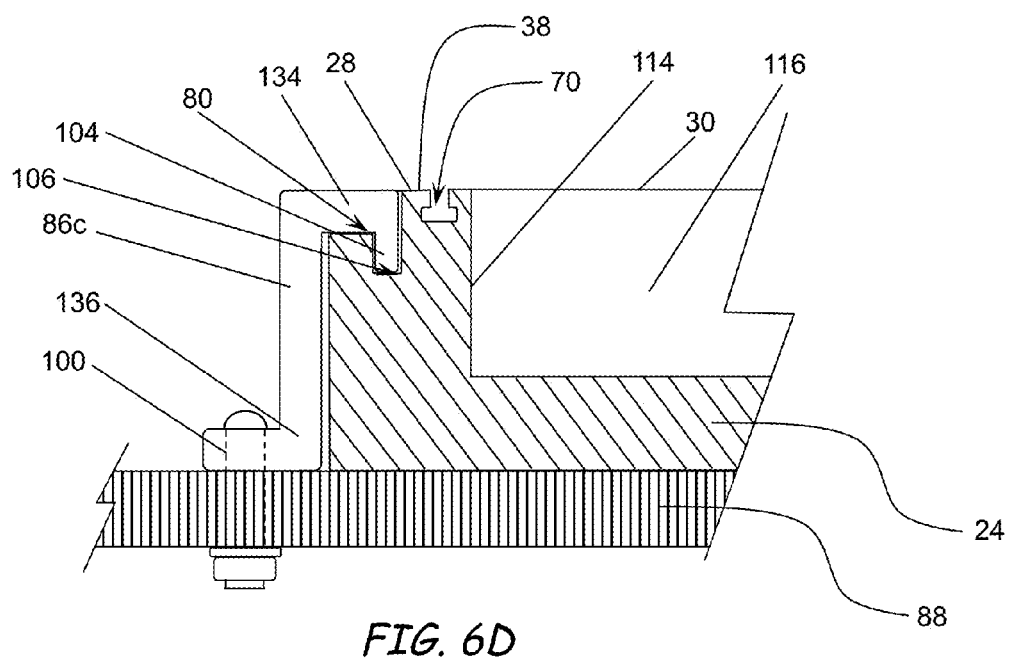
FIG. 6D is a cross-sectional view of the solar panel housing and an attachment means according to still yet another embodiment of the present invention.

Upper portion 134 of bracket 86c illustrated in FIG. 6D may include a hook feature 104 that may be configured to engage a slot 106 of tray 14 to secure bracket 86c to tray 14. Bracket 86c may be configured in a generally "S" shaped fashion as illustrated in the FIGS. 6A, 6C, 6D and 7A or configured in a generally "U" shaped fashion as depicted in FIGS. 6B and 7B. Bracket 86c may be positioned such that hook 104 of upper portion 134 of bracket 86c engages slot 106 and notch 80 and lower portion 136 engages base 88. Lower portion 136 includes hole 100 as described above. With bracket 86c located in position at notch 80, the fastener may be introduced into hole 100 and tightened in a typical fashion to secure bracket 86c to base 88. As the clamping force between lower portion 136 of bracket 86c and base 88 increases, the clamping force of upper portion 134 increases against notch 80, slot 106 and tray 14 to secure tray 14 and housing 11 to base 88.

Brackets 86a, 86b and 86c may also include a second hole 102 (See e.g. FIG. 6C) that may be sized to accept a typical fastener such as a bolt, screw and the like so that brackets 86a, 86b and 86c may be furthered secured to tray 14 of housing 11.

In another embodiment of the present invention, notch 80 (and slot 106) may extend the length of side walls 26, 28, top end cap 30 and bottom end cap 32. Bracket 86a, 86b or 86c may also extend the length of side walls 26, 28, top end cap 30 and bottom end cap 32 and be configured to engage notch 80 (and slot 106) to provide even further mounting and securing stability of tray 14 of housing 11 to base 88.

Figure 8A:
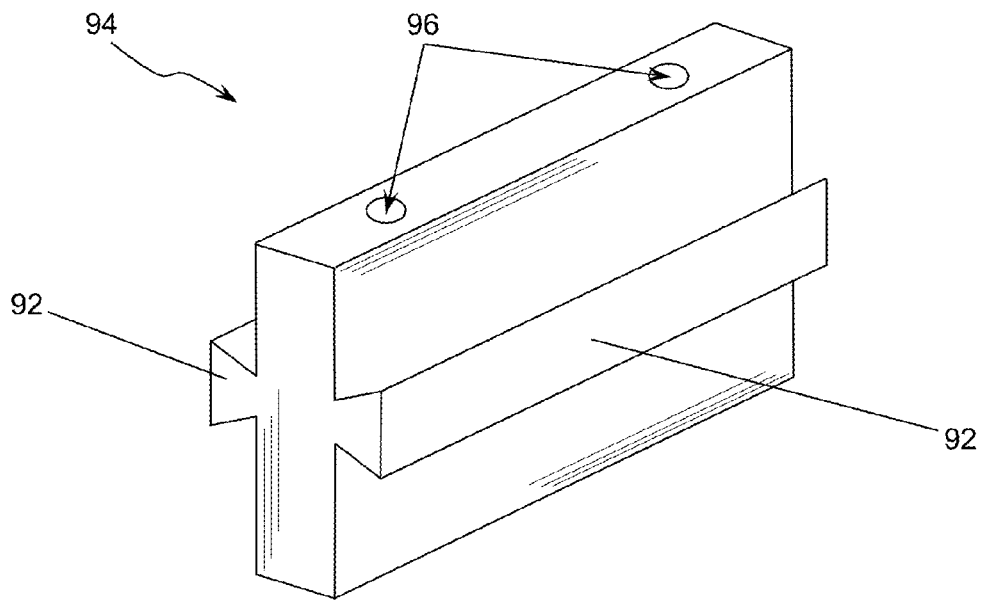
FIG. 8A is a perspective view of an attachment means according to another embodiment of the present invention.
Figure 8B:
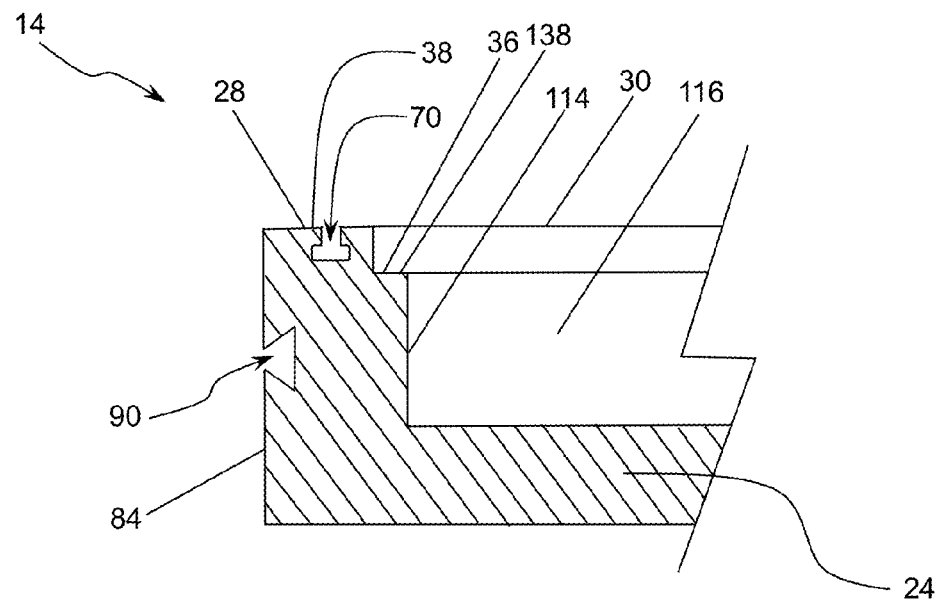
FIG. 8B is a cross-sectional view of a solar panel housing according to yet another embodiment of the present invention.
Figure 8C:
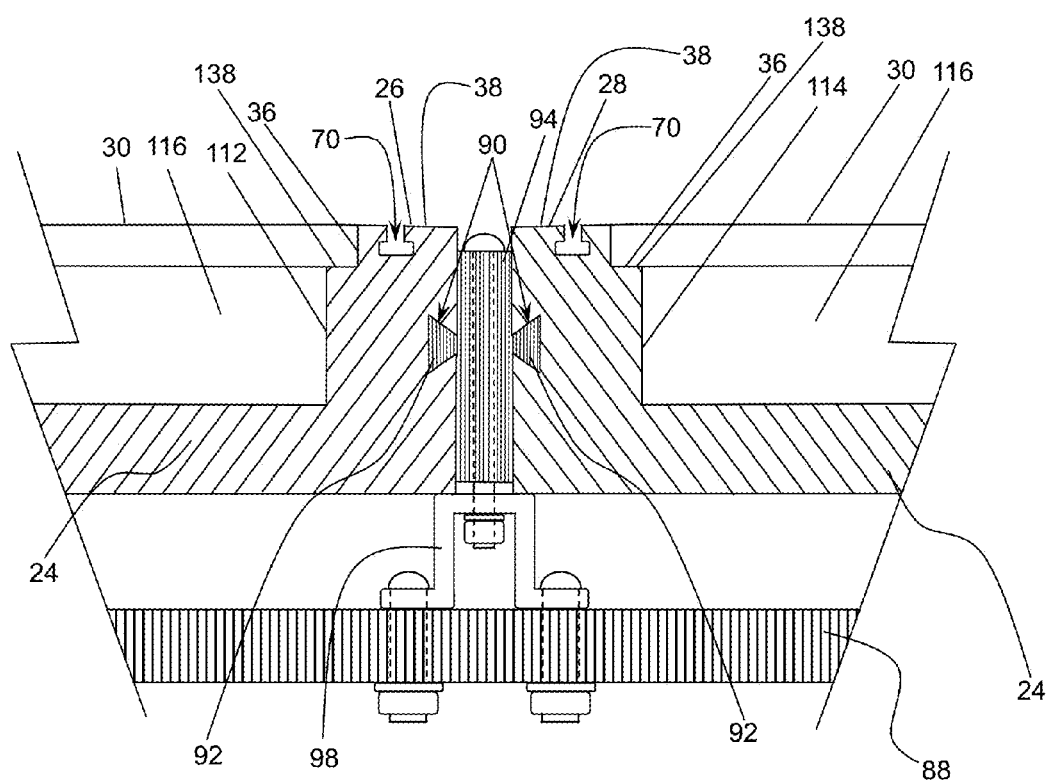
FIG. 8C is a cross-sectional view of the solar panel housing and the attachment means according to an embodiment of the present invention.
Figure 13:
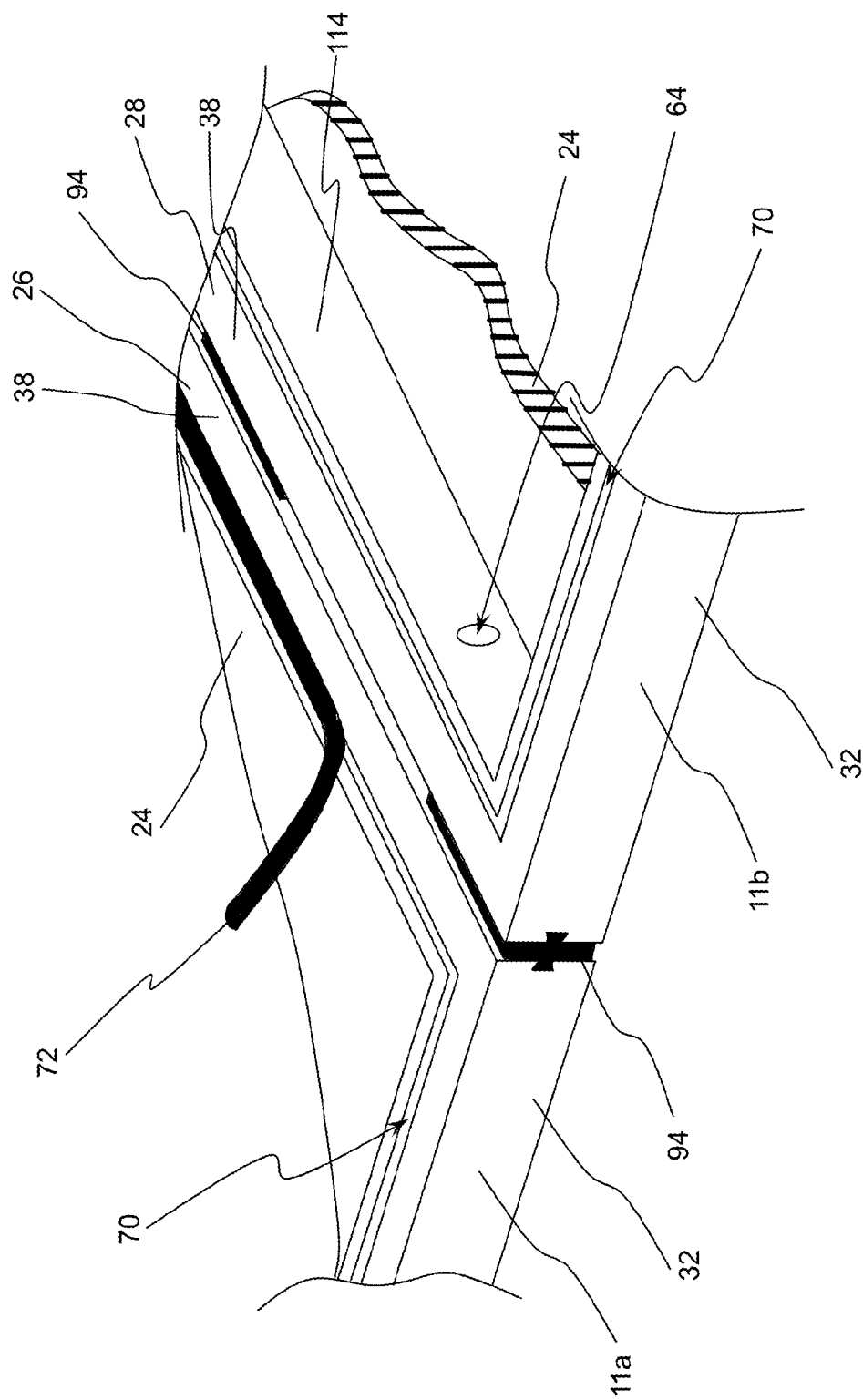
FIG. 13 is a perspective view of two solar panel housings, an attachment means and a securement means according to an embodiment of the present invention.

Alternatively, tray 14 of housing 11 of solar panel 10 may include a mounting feature and securement means according to still another embodiment of the present invention. Exterior faces 82, 84 of side walls 26, 28 may each include a groove 90 that extends a length of side walls 26, 28. The shape of groove 90 may be configured to accept a tongue 92 that extends outward from a mounting block 94 as illustrated in FIGS. 8A-8C. Mounting block 94 may include at least one tongue 92, or, alternatively a second tongue 92 may be added to mounting block 94 such that block 94 can be used to secure and mount two housings 11a, 11b. (See e.g. FIG. 13). Block 94 may also includes one through hole 96 that may be sized to accept a typical fastener such as a bolt, screw and the like so that block 94 may be secured to a mounting bracket 98 and to base 88 such as a roof or mounting rack.

Tongue 92 may be configured in the general shape of a trapezoid extending generally outward from block 94. Groove 90 may be configured in the same general trapezoidal shape but extending into exterior faces 82, 84. Block 94 may be secured to tray 14 by introducing tongue 92 into groove 90 by a typical sliding means. As tongue 92 is introduced into grove 90, the edges of tongue 92 may engage the edges of groove 90 to secure tongue 92 in groove 90. With tongue 92 secured in groove 90, block 94 may slide freely along side walls 26, 28 and be positioned in any desired location along side walls 26, 28. While block 94 may slide freely along side walls 26, 28, the tongue and groove securement will prevent block 94 from being pulled away from tray 14. The tongue and groove securement will only allow block 94 to slide fore and aft along side walls 26, 28 (See e.g. FIG. 13). as housings 11 are assembled to one another. Once housings 11a, 11b are positioned, a fastener may be introduced into hole 96 to secure block 94 to mounting bracket 98 and ultimately to base 88.

Top end cap 30 and bottom end cap 30 may also include groove 90 (not shown) that may be formed in a outside face of top end cap 30 and a outside face of bottom end cap 32 as described above for side walls 26, 28 to accept block 94 to further secure and mount tray 14 of panel 10 to base 88.

In yet another embodiment of the present invention, block 94 may be sized such that it extends the length of side walls 26, 28, top end cap 30 and bottom end cap 32. Tongue 92 of block 94 may be introduced into grove 90 of side walls 26, 28, top end cap 30 and bottom end cap 32. Block will slide freely against side walls 26, 28, top end cap 30 and bottom end cap 32 until the entire tongue 92 of block 94 is seated in groove 90. Block 94 may be secured to a mounting bracket as described above or directly to base 88 (not shown) to further secure and mount tray 14 of solar panel 10 to base 88.

Each of the pieces of tray 14 may be manufactured from foam such as polystyrene and the like and assembled together with glazing 16 to produce a very light weight housing 11 for encasing photovoltaic cells 12 or fin tubes 20. Any number of processes may be used to manufacture each of the pieces, such as cutting each piece from a block of material, blow molding each of the pieces, forming each piece from the material, injection molding, rotational molding and like processes. The foam tray may then be encased in a coating, such a polyurea, to strengthen tray 14 and to protect the tray from the weather elements. Manufacturing tray 14 in this manner will help to decrease the weight of housing 11 and solar panel 10 versus conventional metal panels that are widely known in the art. Although tray 14 has been described above as being manufactured from a foam product, tray 14 may easily be manufactured from any materials such as any type of plastic, woods, metals, ceramics and the like and yet still maintain light weight properties.

In another embodiment of the present invention, side walls 26, 28, top end cap 30 and bottom end cap 32 may be designed such that they manufactured with bottom plate 24 as one single element. Side walls 26, 28, top end cap 30 and bottom end cap 32 extend generally perpendicular outward from bottom plate 24. Plate 24 and side walls 26, 28, top end cap 30 and bottom end cap 32 may be manufactured in this manner to create cavity 34 and to streamline the assembly process of solar panel 10.

Tray 14 may also be manufactured as a single unitized body having plate 24, side walls 26 and 28, top end cap 30 and bottom end cap 32 all continuously connected together to further reduce assembly costs. The entire tray 14 may be molded or stamped as one member and be manufactured of plastic, foam such as polystyrene, woods, metals, ceramics and the like and yet still maintain light weight properties.

No matter the manufacturing or assembly process or the materials used to create housing 11, housing 11 may be made in various sizes and shapes. Housing 11 may be manufactured to account for ease of maneuverability during installation, yet allow for a large enough size of solar panel 10 to limit electrical or plumbing connections if a number of panels are being used. Housing 11 may also be designed and manufactured with flexibility to adapt to various roof types and styles as well. For example, a roof may have a curvature that may make mounting a typical solar panel very difficult. Housing 11 may be manufactured in a manner that could accommodate the roof curvature and enable installation of solar panel 10.

As stated previously, housing 11 includes glazed element or glazing 16 that is designed and configured to seat at lip 36 such that cavity 34 may be sealed. Glazing 16 may be configured with any number of layers to adequately seal cavity 34 while providing an optimal pass through of solar radiation to photovoltaic cells 12 and fin tubes 20 to promote the generation of electrical power and thermal energy, respectively.

Figure 9:
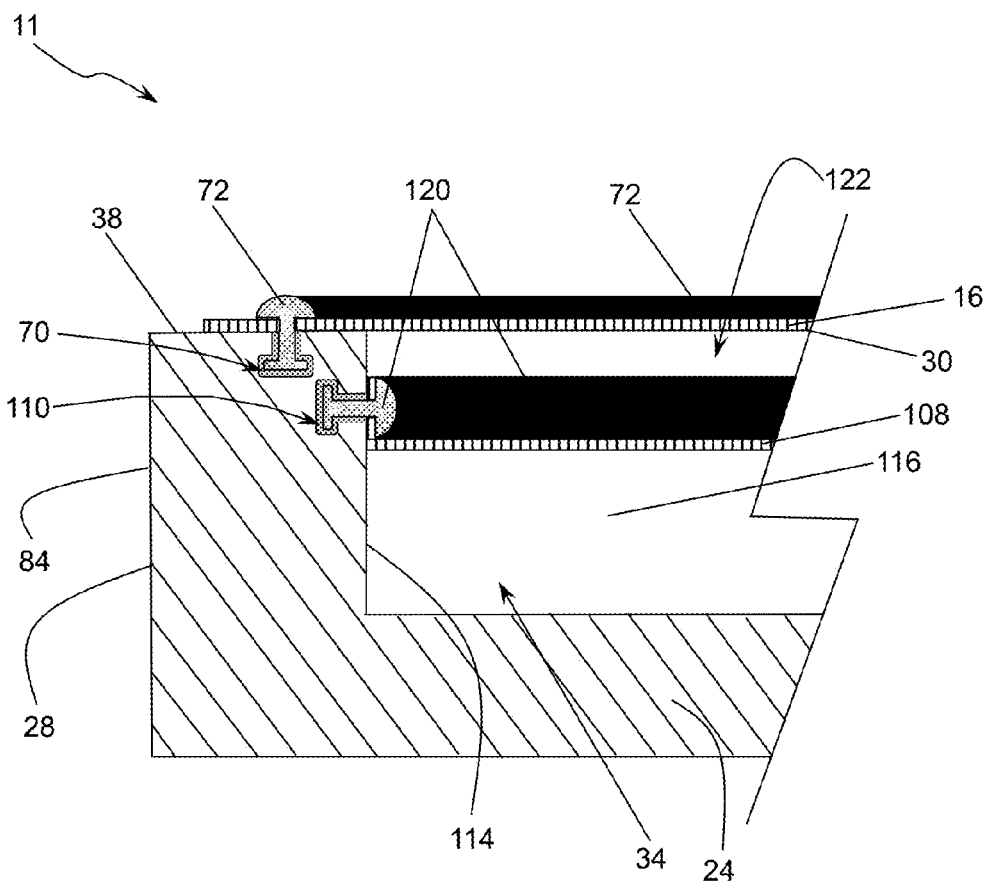
FIG. 9 is a cross-sectional view of a solar panel housing and a glazing securement means according to yet another embodiment of the present invention.
Figure 11A:
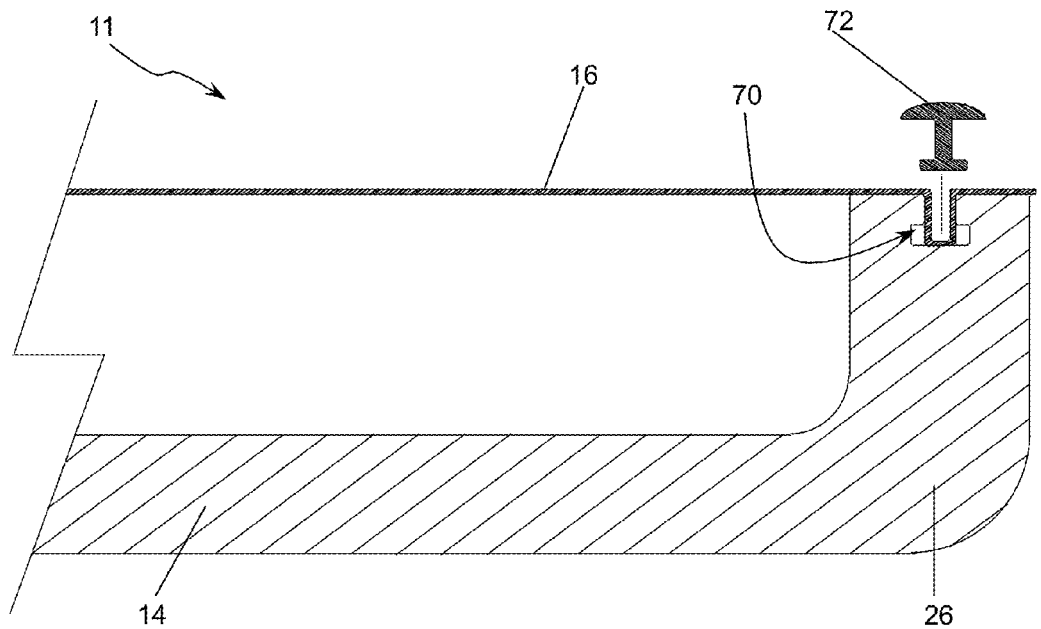
FIGS. 11A and 11B are cross-sectional views of a solar panel housing and a glazing securement means according to yet another embodiment of the present invention.
Figure 11B:
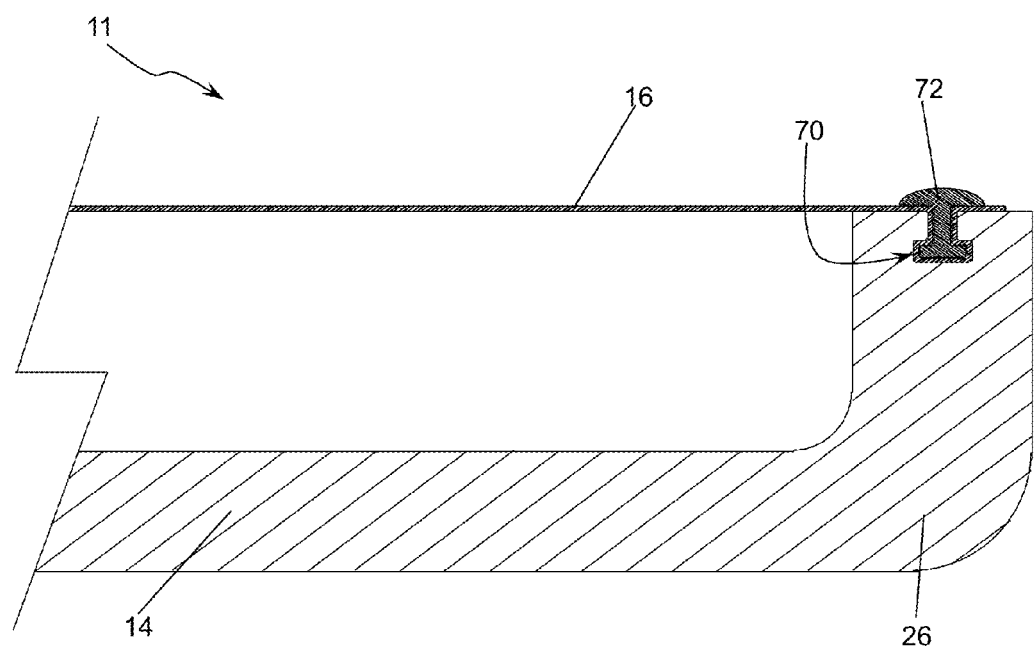

FIGS. 9, 11A and 11B illustrate means to secure glazing 16 to tray 14 to seal housing 34. In this particular embodiment of the present invention, a trough 70 may be added at top surface 38 to each of side walls 26 and 28, top end cap 30 and bottom end cap 32. Trough 70 may be molded into top surface 38 of each of side walls 26 and 28, top end cap 30 and bottom end cap 32 and sized to accept and secure a trim cap 72, a portion of which may be snapped into trough 70 (See e.g. FIG. 13). In this particular embodiment of the present invention, glazing 16 may be of a flexible material such as Halar® and the like and may be configured to be captured in trough 70 by cap 72. Glazing 16 may be stretched across cavity 34 and tray 14 and a portion of glazing 16, near the edges of glazing 16, may be captured in trough 70 by cap 72 thereby securing glazing 16 to tray 14 and sealing cavity 34.

Figure 10:
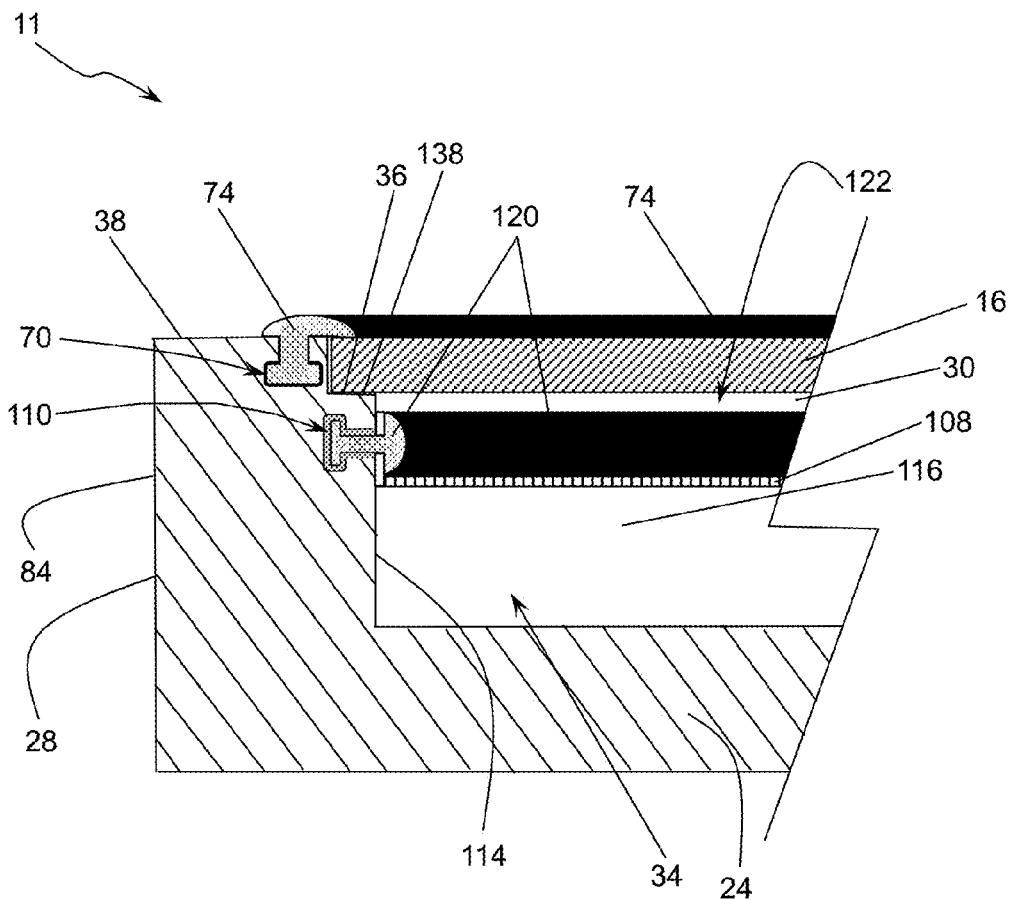
FIG. 10 is a cross-sectional view of a solar panel housing and a glazing securement means according to still another embodiment of the present invention.
Figure 12A:
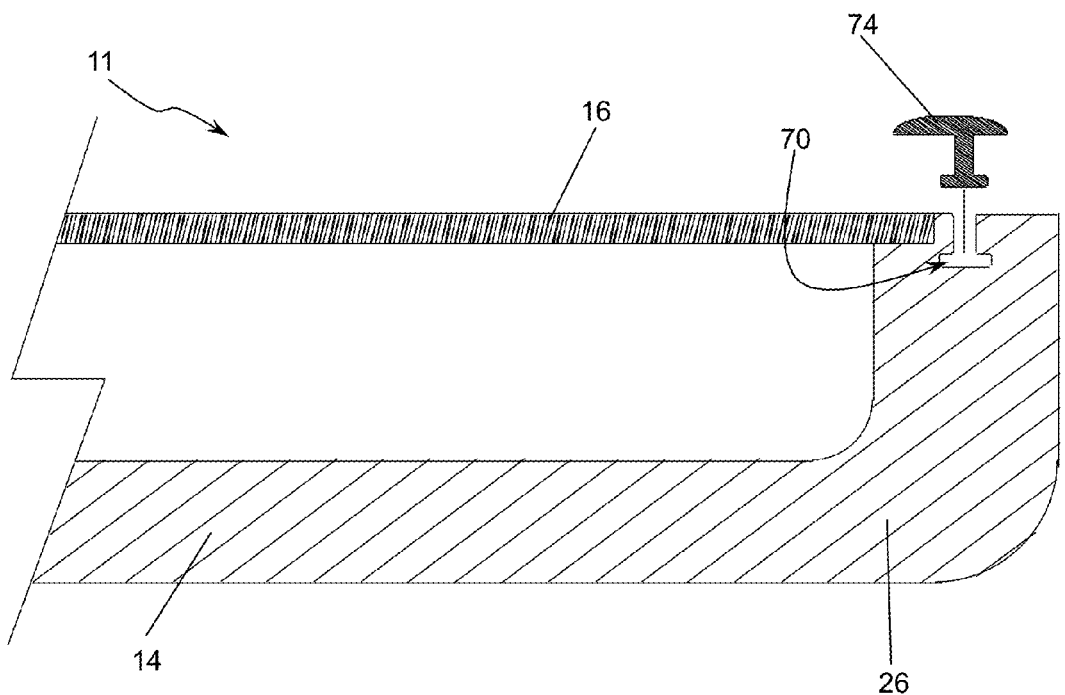
FIGS. 12A and 12B are cross-sectional views of a solar panel housing and a glazing securement means according to still another embodiment of the present invention.
Figure 12B:
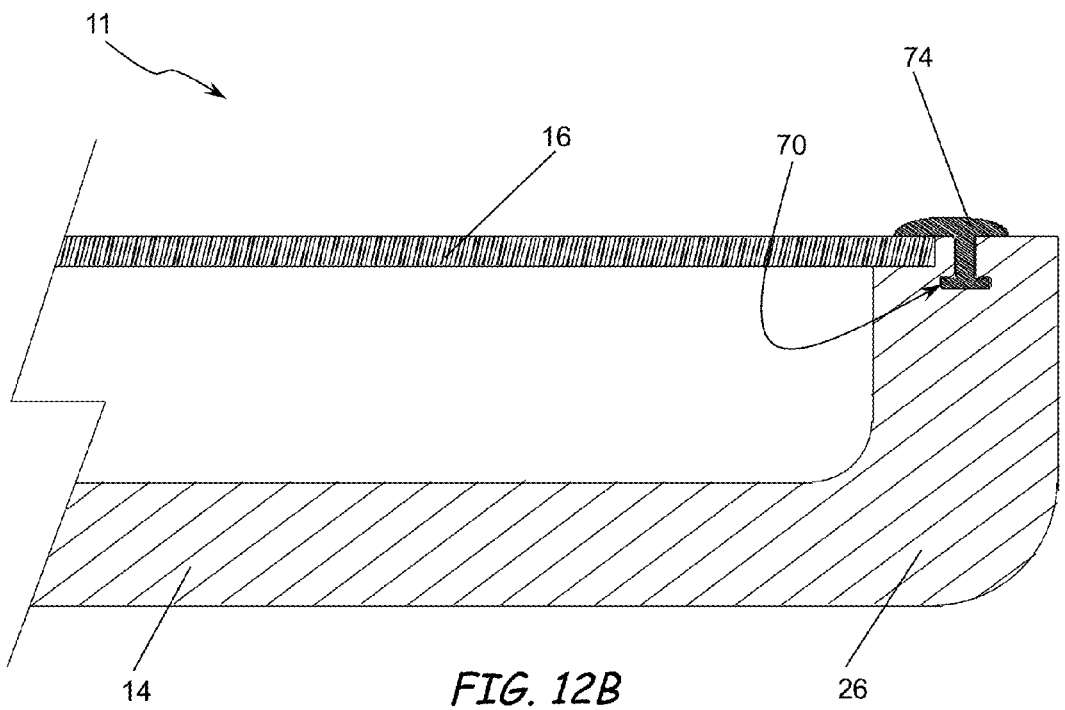

FIGS. 10, 12A and 12B illustrates a further exemplary use of trough 70 and a second trim cap 74. In much the same manner as cap 72 secured glazing 16 to tray 14, second trim cap 74 can also be used to secure glazing 16 to tray 14. In this particular embodiment of the present invention, glazing 16 may be at such a thickness that may prevent glazing 16 from being captured in trough 70 by cap 74. For example, glazing 16 may be of a more rigid material such as rigid plastic or glass. In this instance, cap 74 may be configured such that it captures glazing 16 against lip 36, thereby securing glazing 16 to tray 14. Second trim cap 74 may be configured to engage trough 70 around the entire perimeter of tray 14, or alternatively, second trim cap 74 may be configured such that cap 74 may be positioned at selected locations around the perimeter of tray 14 just as cap 72. In either embodiment, trim cap 72 and second trim cap 74 are configured to engage trough 70 and secure glazing 16 to tray 14 to seal cavity 34.

FIGS. 9 and 10 illustrate still a further embodiment of the present invention. In this particular embodiment, side walls 26, 28, top end cap 30 and bottom end cap 34 include a trough 110 that may be molded into interior face 112, 114, 116, 118 of side walls 26, 28, top end cap 30 and bottom end cap 34. Trough 110 may be sized to accept and secure a trim cap 120, a portion of which may be snapped into trough 110. In this particular embodiment of the present invention, a second layer of glazing 108 may be of a flexible material such as Halar® and the like and may be configured to be captured in trough 110 by cap 120. Glazing 108 may be stretched across cavity 34 and tray 14 and a portion of glazing 16, near the edges of glazing 108, may be captured in trough 110 by cap 120 thereby securing glazing 108 to tray 14 and sealing cavity 34. When housing 11 is configured in this manner, glazing element 16 and glazing element 108 will create an air gap 122. Air gap 122 will act as an insulator to prevent solar panel 10 from overheating in high temperature use and freezing in low temperature use.

Figure 14:
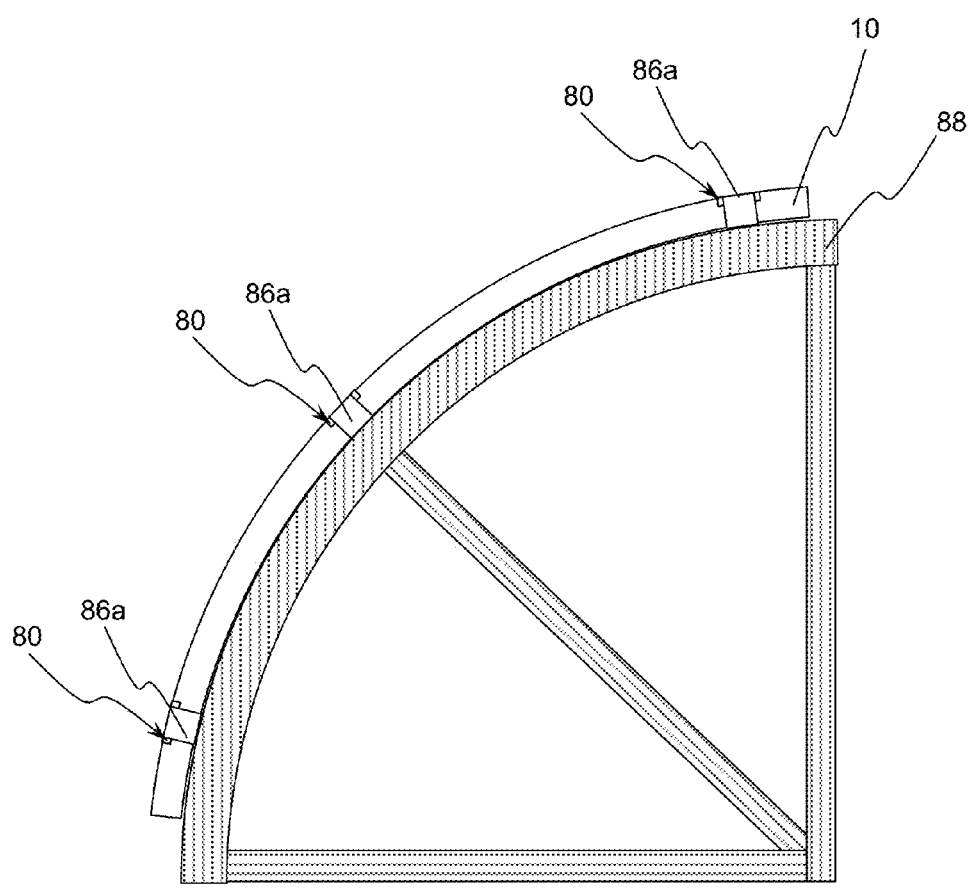
FIG. 14 is a side view of a solar panel housing according to another embodiment of the present invention.

In yet another embodiment of the present invention depicted in FIG. 14, tray 124 may be configured and manufactured to follow the contour of base 88 such as a roof, mounting unit and the like as described above. In an example of this particular embodiment, tray 124 is formed with plate 126, and side walls 128, 130 having arcuate surfaces that are configured to follow the arcuate surface of a roof. The flexible material, such as Halar®, used for glazing 16 and 108 may also be configured to the arcuate surface of tray 124 to seal cavity 132. The ease of manufacturability of tray 124 in this design having arcuate components will ensure that tray 124, housing 11 and solar panel 10 may be adapted to any roof design without the use of extraneous mounting frames and features. The ability to configure tray 124 to any roof design will ensure that solar panel 10 does not impact the architectural aesthetics of a building and will allow architects to maintain creativity to create new building designs while integrating solar panels.

Tray 14, tray 124 and housing 11 have been described above having a number of improvements that will ensure the optimal operation of any solar panel during both the sunlight and evening hours as well. The functional design aspects of housing 11 along with the operational aspects for solar panel 10 described above take advantage of our abundant renewable resources and will help to ensure that we can extend the life of our limited natural resources.

The present invention has been particularly shown and described with reference to the foregoing embodiment, which is merely illustrative of the best modes presently known for carrying out the invention. It should be understood by those skilled in the art that various alternatives to the embodiment of the invention described herein may be employed in practicing the invention without departing from the spirit and scope of the invention as defined in the following claims. It is intended that the following claims define the scope of the invention and that the method within the scope of these claims and their equivalents be covered thereby. This description of the invention should be understood to include all novel and non-obvious combination of elements described herein, and claims may be presented in this or a later application to any novel non-obvious combination of these elements. Moreover, the foregoing embodiment is illustrative, and no single feature or element is essential to all possible combinations that may be claimed in this or a later application.

Figure 15:
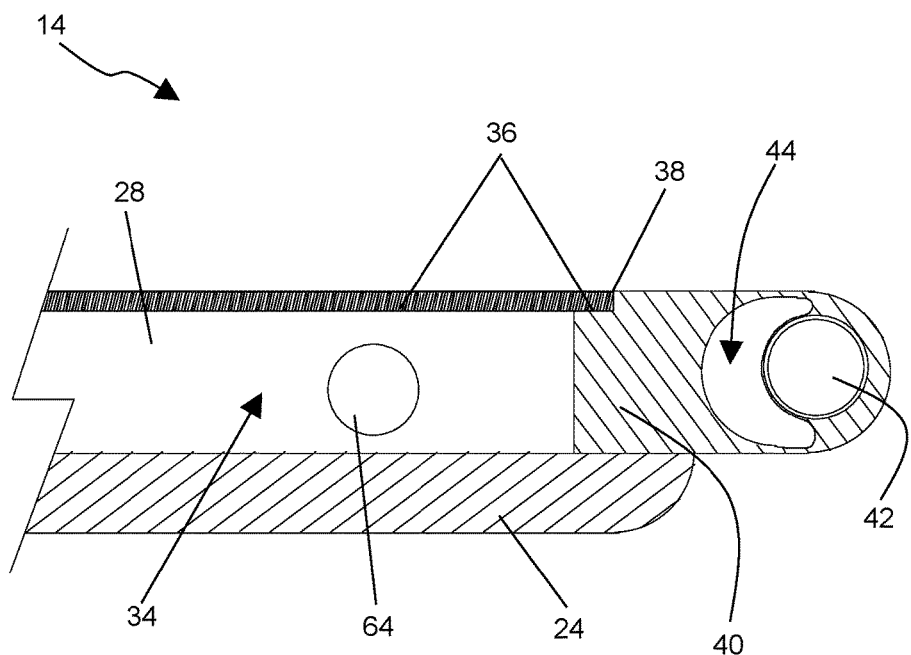
FIG. 15 is a cross-sectional view of a solar panel housing according to still another embodiment of the present invention.

Now referring to FIG. 15, tray 14 is illustrated with a top header 40 according to another embodiment of the present invention. In this particular embodiment of the present invention, top end cap 30 may be modified to include a header 40 and provide housing 11 and solar panel 10 with further operational features. Header 40 may include at least one pipe 42 that extends a length of header 40. Pipe 42 may be plumbed into the any conventional plumbing system of a building to allow fluid to flow from the building through pipe 42 of header 40 and back to building. Header 40 may include a void 44 that will allow air to enter header 40, circulate around pipe 42 and exit header 40. Alternatively, header 40 may include another pipe (not shown) for directing an air flow proximate pipe 42. When used in this manner, header 40 may be an air-to-fluid heat exchanger.

In this particular embodiment, housing 11 may be used to take advantage the night air, which may typically be at a lower temperature than the air during the sunlit day. Water or other fluids that may be passed through pipe 42 of header 40 will encounter air that is at a lower temperature then the fluid passing though pipe 42. As with any type of heat exchange, the fluid passing through pipe 42 that is at a higher temperature than the air will begin to lower in temperature and approach the temperature of the air as the temperature of the air increases to that of the fluid temperature. A constant supply of cool air into header 40 through void 44 and around pipe 42 will continue to lower the temperature of the fluid passing though pipe 42. As stated previously, a number of housings 11 and solar panels 10 may be assembled in an array such that the length of pipe 42 may be increased in length to maximize exposure to the air. While header 40 has been described in use with a single pipe 42 for directing a fluid through header 40, it is important to note, however, that multiple pipes may be plumbed through header 40 and, yet, still achieve the same results of cooling heated water.

Providing for means to raise and lower the temperature of the fluid in the above described manner will not only provide means to heat and cool the fluid but also allows for virtually around the clock usage of housing 11 and solar panel 10. Solar panel 10 may be used during sunlight hours to raise the temperature of fluids such as potable water for drinking, swimming, bathing and heating residences and commercial buildings. Solar panel 10 may also be used during the night hours to lower the temperature of fluids such as potable water for drinking, creating ice for storage and use at a later time and cooling residences and commercial buildings.

Figure 16:
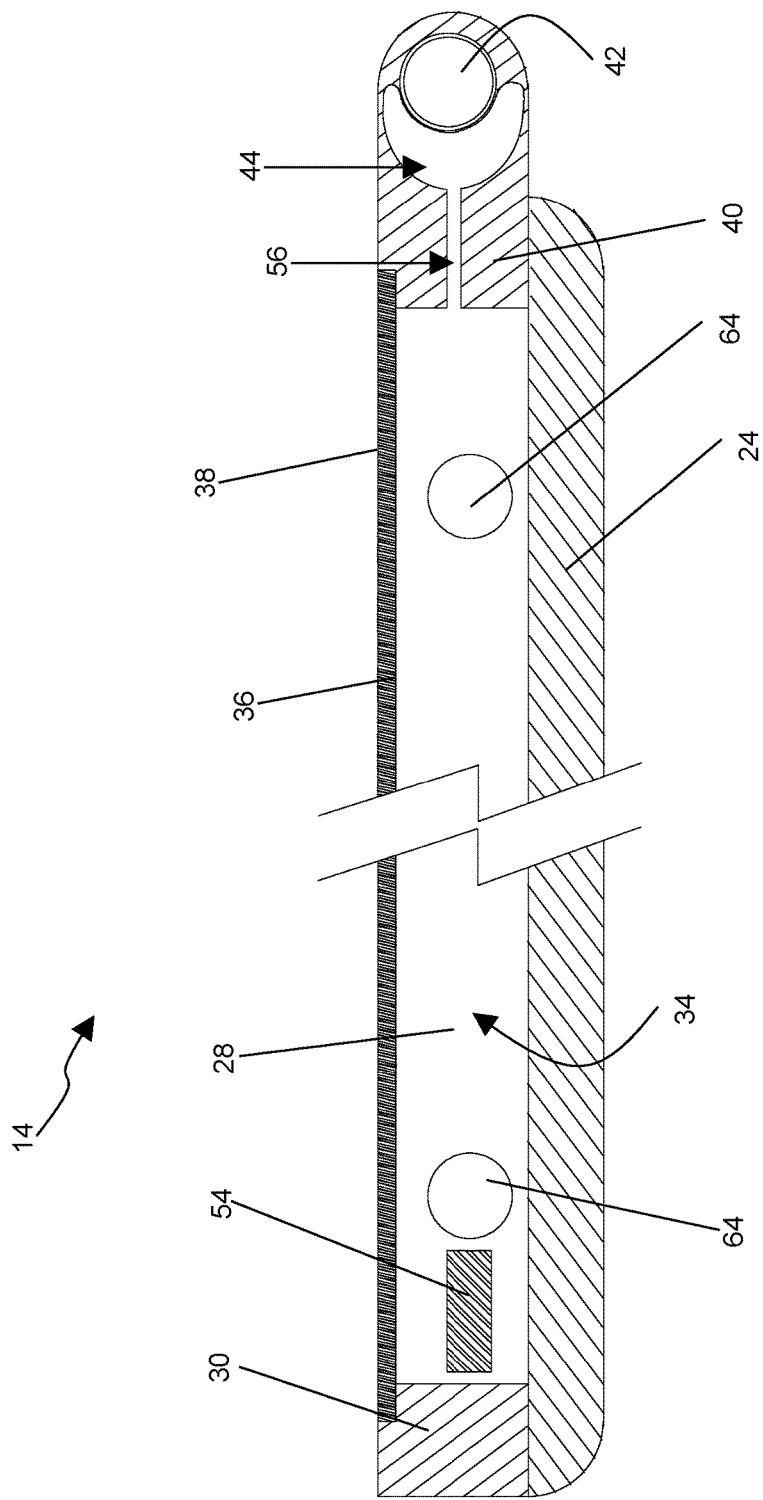
FIG. 16 is a side view of a solar panel housing according to an embodiment of the present invention.

Typically, and as expected, solar panels will tend to increase in heat when exposed to sun. With photovoltaic cells, as is well known in the art, they will tend to operate at an optimal level within a specific temperature range. If the temperature of the cells decrease or increase outside of the range, the cells will begin to operate less efficiently in their operation of converting solar energy to electrical energy. One means to control the overheating of the panels is to allow some ambient or cool air to flow throughout panel 10 and the cells to help maintain the temperature in panel 10 at an optimal level for electrical power generation. In another embodiment of the present invention illustrated in FIG. 16, side walls 26 and 28 as well as bottom end cap 32 may include an aperture 54 that may be covered with bristles to allow the escape of air from solar panel 10 while at the same time helping to limit the amount of air and debris entering solar panel 10. An air flow may be introduced at header 40 through void 44 and directed through holes 56 of header 40 and into cavity 34, across cells 12 and out aperture 54 in an effort to maintain the temperature of cavity 34 at the optimal level for electrical generation.

The same aperture and bristle configuration described above may be used with thermal solar panels as well. In this particular embodiment of the present invention, fluid may be pumped through fin tubes 20 during the night hours. Ambient night air may be introduced through void 44 in header 40 and directed through holes 56, into cavity 34, across fin tubes 20 and out aperture 54. As stated above, when solar panel 10 is used in this manner, the fluid circulating in fin tubes 20 will tend to cool thus providing potable water for drinking, creating ice for storage and use at a later time and cooling residences and commercial buildings.

What is claimed is:

1. A housing for a solar panel comprising:
   a glazed element; and a tray; said tray including:
  a plate;
  a pair of side walls extending generally vertical from said plate and from opposing ends of said plate, said pair of side walls include at least one first aperture, said at least one first aperture configured to allow passage of a tube or conduit;
  a top end cap extending generally vertical from said plate;
  a bottom end cap extending generally vertical from said plate at an opposite end from said top end cap;
  a top surface of said pair of side walls, said top end cap and said bottom end cap;
  a lip, said lip positioned proximate a junction of said top surface of said pair of side walls, said top end cap and said bottom end cap and an interior wall of said pair of side walls, said top end cap and said bottom end cap, said lip including a seating surface that is positioned below said top surface of said pair of side walls, said top end cap and said bottom end cap, said lip extending the interior perimeter of each of said pair of side walls, said top end cap and said bottom end cap, and said lip configured to seat said glazed element such that a top surface of said glazed element is flush to said top surface of said pair of side walls, said top end cap and said bottom end cap;
  wherein said plate, said pair of side walls, said top end cap, said bottom end cap, said top surface of said pair of side walls, said top end cap and said bottom end cap and said lip are formed of a single material and as a single integral component; and
  wherein said plate, said pair of side walls, said top end cap and said bottom end cap collectively form a cavity; and
  wherein said top end cap includes a top header, said top header extending the length of said top end cap, said top header extending outward from said top end cap and in a direction away from said cavity, said top header including:
    at least one pipe extending outwardly from said top header at both ends of said top header and extending the length of said top header and throughout an interior space of said top header;
    at least one void extending the length of said top header and throughout the interior space of said top header, said void positioned proximate the exterior of said pipe and distinct from said pipe; and
    at least one hole extending from said void through said top end cap to said cavity.

2. The housing as recited in claim 1, wherein said housing further includes at least one notch, said at least one notch positioned proximate a junction of said top surface and an exterior face of said pair of side walls, said top end cap and said bottom end cap, said notch formed as a step-like feature at the intersection of said top surface and said exterior face, said notch including a rear wall extending vertically downward from said top surface, said notch sized to receive an upper portion of a first securement device, said upper portion of said first securement device extending horizontally from said first securement device into said notch to engage said notch, said first securement device including a lower portion, said lower portion extending horizontally from said first securement device in an opposite direction from said upper portion, said first securement device including a first body extending generally vertically between said upper portion and said lower portion, said lower portion including a first hole to accept a fastener to secure said first securement device to a base, thereby fixing the position of said housing relative to said base.

3. The housing as recited in claim 2, wherein said notch further includes a slot, said slot extending vertically into said housing from a horizontal surface of said notch, said upper portion of said first securement device further includes a hook feature extending vertically downward from said upper portion to engage said a slot of said notch further fixing the position of said housing relative to said base.

4. The housing as recited in claim 3, wherein said first securement device is a bracket configured in the general shape of an "S".

5. The housing as recited in claim 4, wherein said bracket includes a second hole sized to accept a fastener to affix said bracket to said tray.

6. The housing as recited in claim 3, wherein said first securement device is a bracket configured in the general shape of an "U" said "U" shaped bracket including a second upper portion extending horizontally from a second body of said first securement device, said second portion extending in an opposite direction from said first upper portion into a notch to engage said notch of a second housing, said lower portion extending from said first body to said second body and including said first hole sized to accept a fastener to secure said "U" shaped bracket to said base, thereby fixing the position of said housing and said second housing relative to said base.

7. The housing as recited in claim 6, wherein said bracket includes a second upper portion, said second upper portion including a second hook feature extending vertically downward from said second upper portion to engage a second slot of a second notch and secure said bracket to a second housing further fixing the position of said second housing relative to said base.

8. The housing as recited in claim 7, wherein said bracket includes a second hole sized to accept a fastener to affix said bracket to said tray and a third hole sized to accept a fastener to affix said bracket to said second tray.

9. The housing as recited in claim 3, wherein said tray includes:
  a groove, said grove positioned on an exterior face of said pair of side walls, said top end cap and said bottom end gap; and
  a second securement device, said second securement device configured to engage said groove and secure said housing to the base.

10. The housing as recited in claim 9, wherein said second securement device is a mounting block, said mounting block including at least one tongue extending generally perpendicular and outward from a side of said mounting block, said tongue configured to engage said groove of said tray.

11. The housing as recited in claim 10, wherein said mounting block include at least one hole sized to accept a fastener to affix said mounting block to said base.

12. The housing as recited in claim 1, wherein said glazed element is configured to engage said lip and encase said cavity.

13. The housing as recited in claim 1, wherein said single material of said plate, said pair of side walls, said top end cap, said bottom end cap, said top surface of said pair of side walls, said top end cap and said bottom end cap and said lip is a polystyrene foam.

14. The housing as recited in claim 5, wherein said tray is encased in a coating to protect said tray from the weather elements.

15. The housing as recited in claim 1, wherein said single material of said plate, said pair of side walls, said top end cap, said bottom end cap, said top surface of said pair of side walls, said top end cap and said bottom end cap and said lip is a weather resistant plastic.

16. The housing as recited in claim 1, wherein said glazed element may include multiple layers, said multiple layers of said glazed element being separated by a gap.

17. The housing as recited in claim 1, wherein said tray includes a first trough, said first trough molded into said top surface of said pair of side walls, said top end cap and said bottom end cap, said trough extending a perimeter of said tray at said top surface and said first trough configured to capture a portion of said glazed element.

18. The housing as recited in claim 17, wherein said housing further includes a first trim cap, said first trim cap configured to engage said first trough and secure said glazed element to said tray.

19. The housing as recited in claim 18, wherein said tray includes a second trough, said second trough molded into an interior face of said pair of side walls, said top end cap and said bottom end cap, said second trough extending an interior perimeter of said tray at said interior face and said trough configured to capture a portion of said glazed element.

20. The housing as recited in claim 19, wherein said housing further includes a second trim cap, said second trim cap configured to engage said second trough and secure said glazed element to said tray.

21. The housing as recited in claim 1, wherein said tray is configured with an arcuate formed said plate and arcuate formed said pair of side walls to follow an arcuate contour of said base.

* * * * *